(12) United States Patent
Wang et al.

(10) Patent No.: US 8,697,521 B2
(45) Date of Patent: Apr. 15, 2014

(54) STRUCTURE AND METHOD FOR MAKING LOW LEAKAGE AND LOW MISMATCH NMOSFET

(75) Inventors: Xinlin Wang, Poughkeepsie, NY (US);
Xiangdong Chen, Irvine, CA (US);
Haining S. Yang, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 12/691,183

(22) Filed: Jan. 21, 2010

(65) Prior Publication Data
US 2011/0175170 A1    Jul. 21, 2011

(51) Int. Cl.
*H01L 27/092*    (2006.01)

(52) U.S. Cl.
USPC ............ 438/275; 438/197; 257/390; 257/391

(58) Field of Classification Search
USPC ........................................................ 438/265
See application file for complete search history.

(56) References Cited

U.S. PATENT DOCUMENTS

| | | | |
|---|---|---|---|
| 5,552,332 A | 9/1996 | Tseng et al. | |
| 6,051,458 A * | 4/2000 | Liang et al. | 438/224 |
| 6,803,285 B2 * | 10/2004 | Mistry et al. | 438/276 |
| 7,488,656 B2 | 2/2009 | Cartier et al. | |
| 2008/0308872 A1 * | 12/2008 | Bu et al. | 257/369 |
| 2009/0039436 A1 | 2/2009 | Doris et al. | |
| 2009/0108294 A1 | 4/2009 | Choi et al. | |
| 2009/0108350 A1 | 4/2009 | Cai et al. | |
| 2009/0108356 A1 | 4/2009 | Cheng et al. | |
| 2009/0108372 A1 | 4/2009 | Chen et al. | |
| 2009/0258471 A1 * | 10/2009 | Sadra et al. | 438/423 |

OTHER PUBLICATIONS

D. O'Meara, K. Hasebe, A. Dip, S. Maku, K. Matsushita, R. Mo, P. Higgins, M. Chudzik, M. Gribelyuk, L. Tai; Silicon Nitride Molecular Layer Deposition Process Development using Dichlorosilane and Ammonia; Abstract 1064; 210th ECS Meeting; MA2006-02, Oct. 29-Nov. 3, 2006 , Cancun, Mexico; E3—Atomic Layer Deposition Applications 2.*

Doris, Bruce et al.; High Performance FDSOI CMOS Technology with Metal Gate and High-k; 2005 Symposium on VLSI Technology, Kyoto; Jun. 2005; pp. 214-215.

* cited by examiner

*Primary Examiner* — Colleen Matthews
*Assistant Examiner* — William Harriston
(74) *Attorney, Agent, or Firm* — Joseph P. Abate; Howard M. Cohn

(57) ABSTRACT

An improved SRAM and fabrication method are disclosed. The method comprises use of a nitride layer to encapsulate PFETs and logic NFETs, protecting the gates of those devices from oxygen exposure. NFETs that are used in the SRAM cells are exposed to oxygen during the anneal process, which alters the effective work function of the gate metal, such that the threshold voltage is increased, without the need for increasing the dopant concentration, which can adversely affect issues such as mismatch due to random dopant fluctuation, GIDL and junction leakage.

11 Claims, 7 Drawing Sheets

STRUCTURE AND METHOD FOR MAKING LOW LEAKAGE AND LOW MISMATCH NMOSFET

FIELD OF THE INVENTION

The present invention is related to integrated circuit power consumption and more particularly to reducing static random access memory (SRAM) power consumption.

BACKGROUND OF THE INVENTION

Semiconductor technology and chip manufacturing advances have resulted in a steady increase of on-chip clock frequencies, the number of transistors on a single chip and the die size itself, coupled with a corresponding decrease in chip supply voltage and chip feature size. Generally, all other factors being constant, the power consumed by a given clocked unit increases linearly with the frequency of switching within it. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, net power consumption reduction is important but, without degrading performance below acceptable levels.

To minimize power consumption, most integrated circuits (ICs) used in such low end systems (and elsewhere) are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa.

For example, a CMOS inverter is a series connected PFET and NFET pair that are connected between a power supply voltage ($V_{dd}$) and ground (GND). Both are gated by the same input and both drive the same output, the PFET pulling the output high and the NFET pulling the output low at opposite input signal states. Ideally, when the gate of a NFET is below some positive threshold voltage ($V_t$) with respect to its source, the NFET is off, i.e., an open switch. Above $V_t$, the NFET is on conducting current, i.e., the switch is closed. Similarly, a PFET is off when its gate is above its $V_t$, i.e., less negative, and on below $V_t$. Thus, ideally, the CMOS inverter in particular and CMOS circuits in general pass no static (DC) current. Therefore, ideal CMOS circuits use no static or DC power and only consume transient power from charging and discharging capacitive loads.

In practice however, transient power for circuit loads accounts for only a portion of the power consumed by CMOS circuits. A typical FET is much more complex than a switch. FET drain to source current (and so, power consumed) is dependent upon circuit conditions and device voltages. FETs are known to conduct what is known as subthreshold current below threshold for NFETs and above for PFETs. Subthreshold current increases with the magnitude of the device's drain to source voltage (Vds) and inversely with the magnitude of the device $V_t$. Among other things, $V_t$ is inversely proportional to gate oxide thickness. While channel doping can be used to increase $V_t$, doing so can also increase gate induced drain leakage (GIDL) and junction leakage. GIDL and junction leakage can also contribute to static power consumption. Furthermore, SRAM transistors and logic transistors have different gate oxide thickness requirements, and fabricating different gate oxide thicknesses increases manufacturing costs.

As chip features shrink, these leakage sources become more predominant. When multiplied by the millions and even billions of devices on a state of the art IC, even 10 picoAmps (100 pA) of leakage in each devices, for example results in chip leakage on the order of 100 milliAmps (100 mA).

For logic chips such as general and special purpose processors, non-load related power dissipation is fairly randomly distributed throughout the logic. Transient power tends to dominate logic chip power consumption. Arrays, however, such as random access memories (RAMs) and especially static RAMs (SRAMs), have large areas that may remain dormant during any one operation. Thus, in these dormant areas, leakage can become a substantial source of power consumption and is nearly the sole source of standby power consumption.

A typical SRAM array is an array of SRAM cells that are each essentially a pair of cross-coupled inverters selectively coupled to a pair of complementary bit lines by a pair of pass gates or word line devices. Typically, the cells may be organized n word lines by m bit lines (complementary bit line pairs) by k bits. So, accessing one bit from one of the k (or more) sub-arrays entails selecting one of the n word lines. Of the m cells partially selected by that word line, only one (on one of the m bit lines) may actually be accessed. During a read, each of the bit line pairs rises/droops only to develop enough signal (e.g., 50 mV) for a sense amplifier. During a write, the pair for the cell being accessed may be driven at least what is termed "rail to rail," i.e., to opposite extremes ($V_{dd}$ and GND) and for a short period of time, a portion of those write voltages are passed to the cell. Then, the word line drops isolating the cell from the bit line and, the cell completes latching what was written.

It is well known that any mismatch in the cross coupled inverters, whether inverter load, in inverter devices or layout can introduce cell sensitivities or noise that causes the cell to favor one state over the other. These cell sensitivities can impair cell performance, cell reliability and in the extreme render the RAM useless. Therefore, typically cell designers strive to design perfectly balanced cells.

Since modern portable electronic devices may include several SRAM chips, it is important to reduce power in each. However, typically, memory accounts for a large number of those chips. Therefore, SRAM power consumption can account for a significant portion of system power, making the difference between acceptable and unacceptable system battery life. Therefore, it is desirable to have an SRAM device having reduced power consumption.

SUMMARY OF THE INVENTION

In one embodiment of the present invention, a method of fabricating a semiconductor integrated circuit is provided. The method comprises the steps of: depositing a nitride layer over a substrate comprising a plurality of field effect transistors, the plurality of field effect transistors comprised of low leakage NFETs, logic NFETs and PFETs, wherein each NFET and each PFET comprises a gate stack; etching the nitride layer on the low leakage NFET gate stacks, thereby allowing the low leakage NFET gate stacks to be exposed to oxygen; depositing an oxide layer over the substrate; forming a first spacer set on each of the gate stacks; forming a second spacer set on each of the gate stack adding dopants to the substrate; and performing an activation anneal on the substrate, thereby increasing the threshold voltage of each low leakage NFET within the semiconductor integrated circuit, without adversely affecting PFETs or logic NFETs within the semiconductor integrated circuit.

In another embodiment of the present invention, the step of performing an activation anneal comprises performing a rapid thermal anneal with a temperature ranging from about 950 C to about 1085 C.

In another embodiment of the present invention, the step of adding dopants to the substrate comprises adding sufficient dopants to provide a dopant concentration ranging from about 1e18 cm$^{-3}$ to about 8e18 cm$^{-3}$.

In another embodiment of the present invention, the method further comprises the step of performing a supplemental anneal with oxygen after the activation anneal.

In another embodiment of the present invention, the step of performing a supplemental anneal with oxygen comprises performing an anneal with a temperature ranging from about 500C to about 650C.

In another embodiment of the present invention, the step of performing a supplemental anneal with oxygen comprises performing an anneal for a duration of about 1 minute to about 30 minutes.

In another embodiment of the present invention, the step of etching the nitride layer on the low leakage NFET gate stacks is performed via a hydrofluoric acid solution.

In another embodiment of the present invention, the step of performing a supplemental anneal with oxygen comprises utilizing a source comprising one or more of oxygen ($O_2$), plasma oxygen, ozone ($O_3$) and nitrous oxide ($N_2O$).

In another embodiment of the present invention, the step of depositing the nitride layer is performed via MLD.

In another embodiment of the present invention, the step of depositing the oxide layer comprises depositing an oxide layer having a thickness ranging from about 30 to about 140 angstroms.

In another embodiment of the present invention, the step of depositing the nitride layer comprises depositing a nitride layer having a thickness ranging from about 1 nanometer to about 7 nanometers.

In another embodiment of the present invention, an SRAM chip is provided, which comprises: a plurality of SRAM cells, each SRAM cell comprising a plurality of low leakage NFETs and a plurality of PFETS; a plurality of logic NFETs; wherein each of the PFETs and each of the logic NFETs comprises a gate stack encapsulated by a nitride layer, and wherein each of the low leakage NFETs comprise a gate stack encapsulated by an oxide layer, each gate stack comprised of a high-K dielectric layer, and a metal layer, and wherein a Vt delta exists between the low leakage NFETs and the logic NFETs, wherein the low leakage NFETs have a threshold voltage that is larger than the threshold voltage of the logic NFETs.

In another embodiment of the present invention, the Vt delta ranges from about 100 mV to about 400 mV.

In another embodiment of the present invention, the gate stack further comprises a polysilicon layer disposed above the metal layer.

In another embodiment of the present invention, the effective oxide thickness ranges from about 50 to about 300 angstroms.

In another embodiment of the present invention, the effective oxide thickness of the low leakage NFETs is about 1 to about 8 angstroms thicker than the effective oxide thickness of the PFETs and logic NFETs.

In another embodiment of the present invention, the nitride layer has a thickness ranging from about 1 nanometer to about 7 nanometers.

In another embodiment of the present invention, the metal layer of each gate stack is comprised of TiN.

In another embodiment of the present invention, a semiconductor integrated circuit is provided, which comprises: a plurality of low leakage NFETs, a plurality of logic NFETs, and a plurality of PFETS; wherein each of the low leakage NFETs comprises a gate stack encapsulated by a oxide layer, and wherein each of the PFETs and each of the logic NFETs comprise a gate stack encapsulated by an nitride layer, each gate stack comprised of a high-K dielectric layer, and a metal layer.

In another embodiment of the present invention, the gate stack further comprises a polysilicon layer disposed above the metal layer, wherein the nitride layer has a thickness ranging from about 1 nanometer to about 7 nanometers, the oxide layer has a thickness ranging from about 50 angstroms to about 300 angstroms, and wherein the metal layer of the gate stack is comprised of TiN.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a prior art SRAM cell.

FIG. 2 shows two transistor gate stacks at the starting point of the fabrication process.

FIG. 3 shows two transistors gate stacks after the nitride deposition step.

FIG. 3B shows two transistors gate stacks after the mask step.

FIG. 4 shows two transistors gate stacks after the nitride etch step.

FIG. 5 shows two transistors gate stacks after the oxide deposition step.

FIG. 6 shows two transistors after the spacer 1 formation step.

FIG. 7 shows two transistors after the spacer 2 formation step.

FIG. 8 shows two transistors after the anneal step.

FIG. 9 shows an embodiment of an SRAM comprising low leakage NFETs.

FIG. 10 is a flowchart indicating process steps for fabrication of low leakage NFETs.

Figure 11:
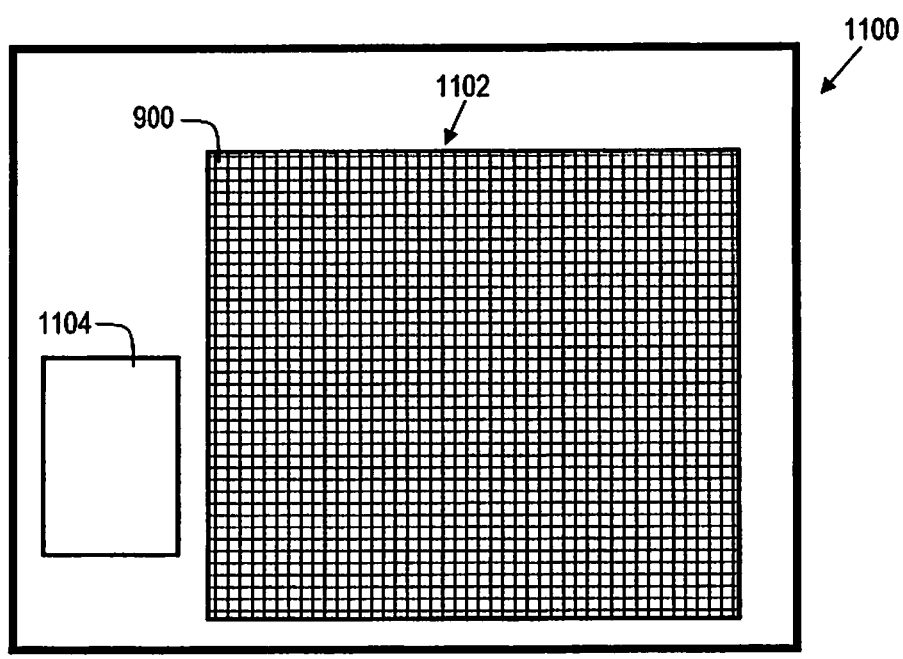

FIG. 11 shows a block diagram of an SRAM chip.

DETAILED DESCRIPTION OF THE INVENTION

The present invention utilizes oxygen diffusion into a high-K metal gate stack to increase the effective gate oxide thickness and change metal gate effective work function.

Using the process disclosed herein, oxygen diffusion only occurs on selected transistors, namely the NFETs that are used in situations where low leakage is an important factor. One such example is that of the NFET transistors that comprise SRAM cells. PFETs, and other NFETs (e.g. for logic purposes) do not have their gate stacks diffused with oxygen. Therefore, the SRAM NFETs are optimized for low leakage, whereas the other transistors (PFETs and logic NFET transistors) are not affected, due to the process steps disclosed herein. While the detailed description discusses embodiments of the present invention that pertain to SRAMS, other embodiments of the present invention can be applied to any circuit where a combination of logic NFETs, low leakage NFETs, and PFETs is desired. Embodiments of the present invention are not limited to SRAM chips, and embodiments of the present invention may be used in a variety of semiconductor integrated circuits.

Figure 1:
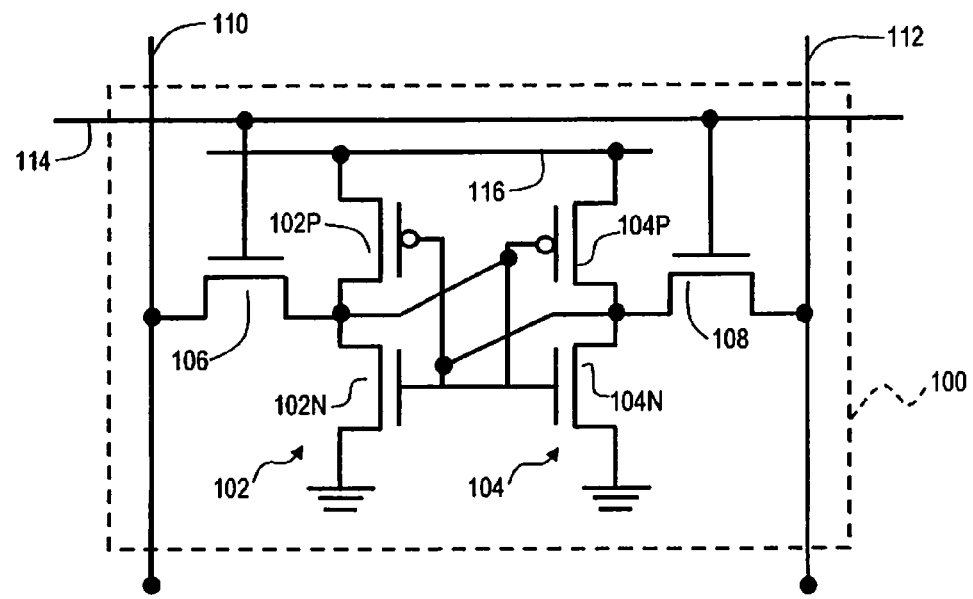

In order to fully appreciate the embodiments of the present invention, a prior art SRAM device will be briefly explained. FIG. 1 shows a prior art SRAM cell 100. Cell leakage is reduced by selectively providing increasing threshold voltage ($V_T$) to selected cell 100 FET pairs, e.g., by selectively thickening the gate oxide above the stated design gate oxide. Thus, by using a suitable high k gate dielectric or by increasing the gate oxide thickness or both, selected device threshold voltage is increased and, accordingly, device leakage is reduced. Examples of high k gate dielectric include $Al_2O_3$, $ZrO_2$, $HfO_2$, $InO_2$, $LaO_2$ and $TaO_2$. These high k metal oxide dielectrics are provided for example only.

Data is stored in the cell 100 in a pair of cross-coupled inverters 102, 104. The first inverter 102 includes NFET 102N and p-type FET (PFET) 102P series connected between $V_{dd}$ (116) and ground (GND). The second inverter 104 includes NFET 104N and PFET 104P, which are also series connected between $V_{dd}$ (116) and ground. A pair of pass gates 106, 108 are connected between each of the cross coupled inverters 102, 104 and a respective bit line pair 110, 112. A word line 114 connects the pass gates 106, 108 of numerous parallel SRAM cells 100 in a word or word line direction and partially selects the connected SRAM cells. Typically, a common bit line pair 110, 112 connects numerous identical parallel SRAM cells 100 in a bit line or column. Cells 100 in each column are each connected to a different word line to form an SRAM array or sub-array. Each cell 100 is addressed/selected by intersection of the word line 114 at a bit line pair 110, 112.

In embodiments of the present invention, in order to reduce leakage in an SRAM cell, the NFETs (106, 108, 102N and 104N in the FIG. 1) receive processing to change the effective workfunction of NFET metal gate away from the Silicon conduction band and towards the valance band, causing the effective gate oxide thickness to increase slightly, thereby increasing $V_t$ of selected NFETs, whereas the PFETs and other logic NFET are not affected by the processing steps.

Figure 2:
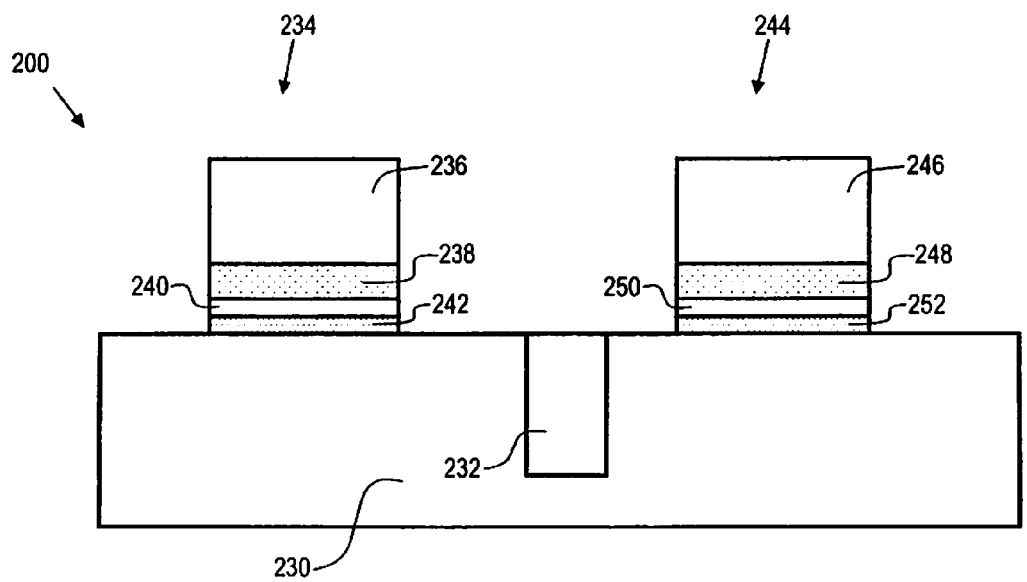

FIG. 2 shows a circuit 200 comprising two transistor gate stacks 234 and 244 on substrate 230, and separated by shallow trench isolation (STI) region 232. This is at the starting point of the inventive fabrication process. These gate stacks are fabricated by industry standard methods that are known in the art. Gate stack 234 is for a transistor that is not to be subject to the oxygen in anneal, and for the purposes of this disclosure will be referred to as a "non-low leakage" transistor (it could be a PFET within an SRAM cell, or a logic NFET). Gate stack 244 is for a low leakage transistor (LLT) that has applicability within an SRAM cell. Gate stack 234 is comprised of gate oxide interfacial layer 242, high-K dielectric layer 240, metal layer 238, and polysilicon layer 236 (236 is optional, it could be filled in metal instead of polysilicon, in which case, 236 and 238 are merged into a metal layer). Similarly, gate stack 244 is comprised of gate oxide interfacial layer 252, high-K dielectric layer 250, metal layer 248, and polysilicon layer 246 (246 is optional, it could be filled in metal instead of polysilicon, in which case 246 and 248 are merged into a metal layer). In one embodiment, high-K dielectric layers 240 and 250 are comprised of a Hf based high-k dielectric material. In one embodiment, metal layers 238 and 248 are comprised of TiN.

Figure 3:
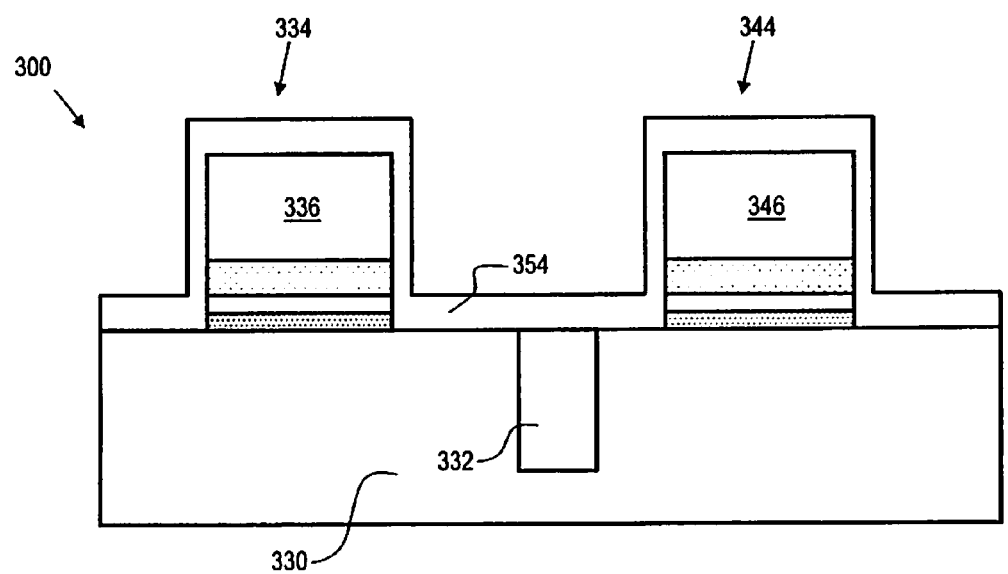
Figure 3B:
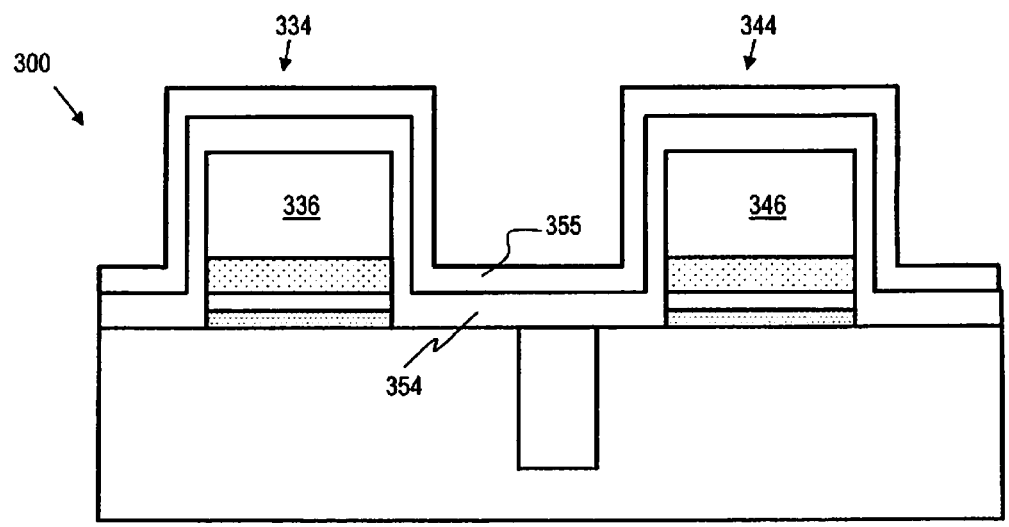

FIG. 3 shows a circuit 300 comprising two transistor gate stacks 334 and 344. As stated previously in this disclosure, similar elements may be referred to by similar numbers in various figures (FIGs) of the drawing, in which case typically the last two significant digits may be the same. For example, transistor gate stacks 334 and 344 are similar to gate stacks 234 and 244, respectively. Furthermore, for the sake of clarity, not all of the reference numbers for the elements the gate stacks 234 and 244 are indicated in FIG. 3 and subsequent figures. In FIG. 3, a nitride layer 354 is deposited over circuit 300. In one embodiment, molecular layer deposition (MLD) is used to deposit the nitride layer 354. MLD provides a dense nitride layer that works well to encapsulate the gate stacks 334 and 344, and prevent their exposure to oxygen. The nitride layer 354 may be comprised of a variety of compounds, including, but not limited to, silicon nitride ($Si_3N_4$). Nitride layer 354 serves to protect the gate stack 336 (corresponding to the logic transistor) from oxygen in a subsequent processing step. In one embodiment, the nitride layer thickness ranges from about 1 nanometer to about 7 nanometers. A thicker nitride layer provides improved encapsulation, and better protection of the gate stacks from oxygen. However, there is a tradeoff in that the pitch (gate-to-gate distance) of the transistors on the chip may limit the maximum thickness of the nitride layer 354. After the nitride layer 354 is applied, a mask 355 (see FIG. 3B) is applied to protect PFETs and logic NFETs from the etch step that follows. Applying such masks via lithographic methods is well known in the industry.

Figure 4:
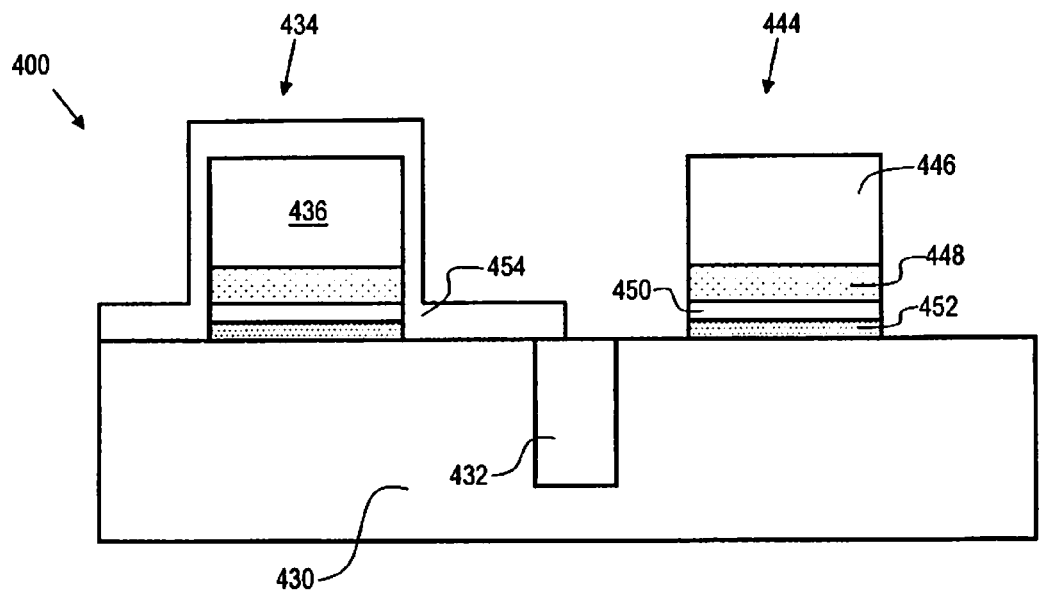

FIG. 4 shows a circuit 400 comprising two transistor gate stacks 434 and 444. In this figure, nitride layer 454 has been etched away from gate stack 444 (compare to nitride layer 354 of FIG. 3) and the mask 355 (see FIG. 3B) that protected PFETs and logic NFETs has been removed. The etching may be performed via any suitable technique. For example, in one embodiment, the etching is performed via a hydrofluoric acid (HF) solution. Gate stack 434 is still protected by nitride layer 454.

Figure 5:
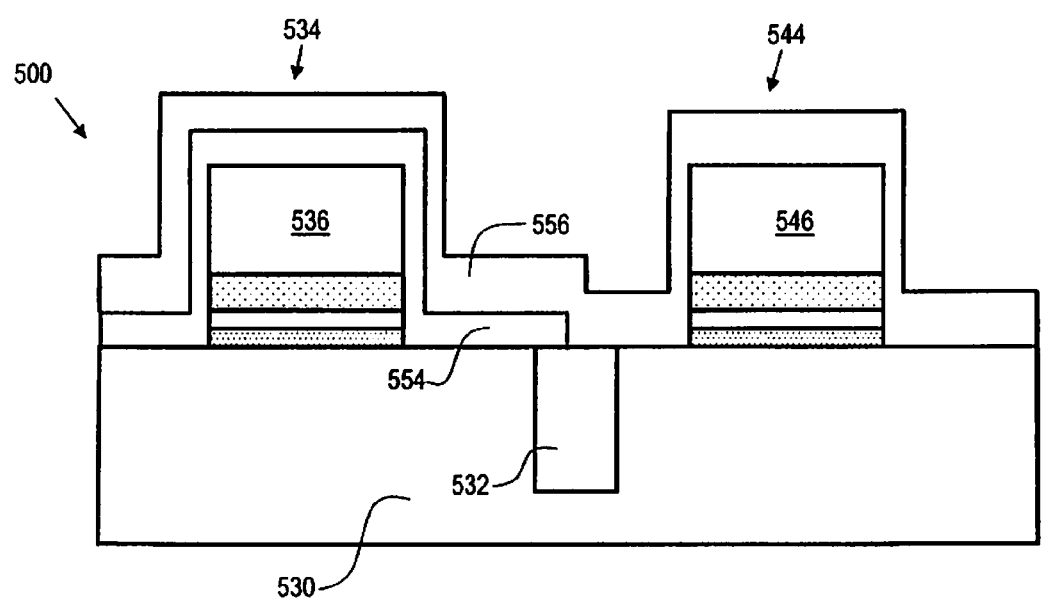

FIG. 5 shows a circuit 500 comprising two transistor gate stacks 534 and 544. In this figure, a low-temperature oxidation (LTO) 556 is deposited over the circuit 500 as part of the steps to form spacers. In one embodiment, the oxide layer 556 ranges from about 30 angstroms to about 140 angstroms in thickness. However, the effective oxide thickness (EOT) ranges from about 50 to about 300 angstroms.

Figures 6, 7:
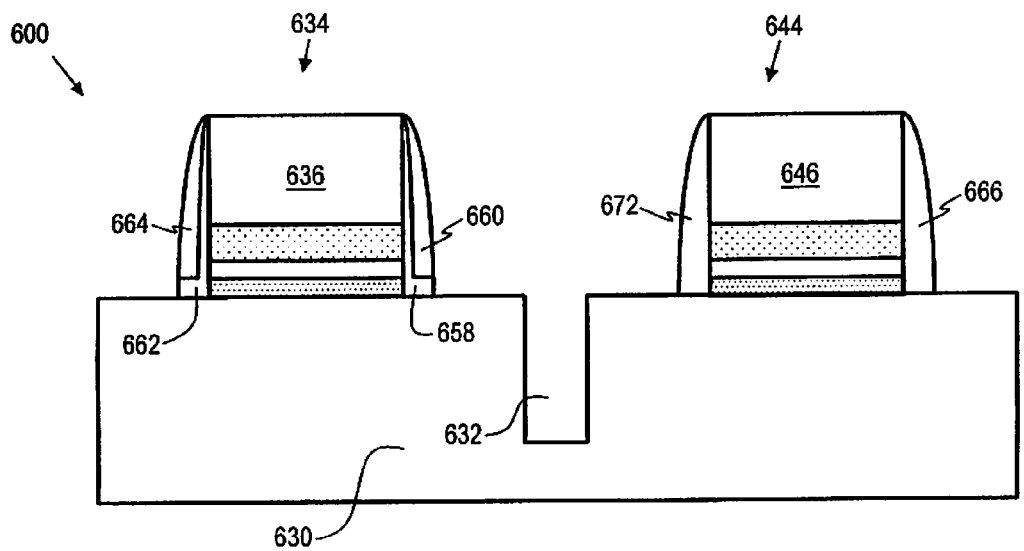

FIG. 6 shows a circuit 600 comprising two transistor gate stacks 634 and 644 after the spacer 1 process step, in which a first set of spacers is formed. Spacers 664 and 660 are formed on gate stack 634 such that a nitride layer 662 and 658 is disposed between the gate stack 634 and spacers 664 and 660. Nitride layers 662 and 658 are remnants of the nitride layer deposited in a previous step (see 354 of FIG. 3). The nitride layers 662 and 658 serve to protect gate stack 634 during a following process step. Spacers 672 and 666 are formed on gate stack 644 (corresponding to a low leakage NFET), and in contrast to spacers 664 and 660, no nitride layer is present between gate stack 664 and spacers 672 and 666. Halo and extension implants, can be performed at this point in the process if necessary. Dopants used in the halo implant step may comprise boron or BF2 for NFETs, and Arsenic for PFETs. Other dopants may be used without departing from the scope and purpose of the present invention. In one embodiment, the dopant concentrations in the channel of the transistor range from about 1e18 cm−3 to about 8e18 cm−3.

FIG. 7 shows a circuit 700 comprising two transistor gate stacks (734 and 744) after the spacer 2 process step, in which a second set of spacers is formed. In this case, spacers 774 and 776 are formed on gate stack 734, and spacers 778 and 780 are formed on gate stack 744. Deep source/drain implanting is also performed if necessary.

Figure 8:
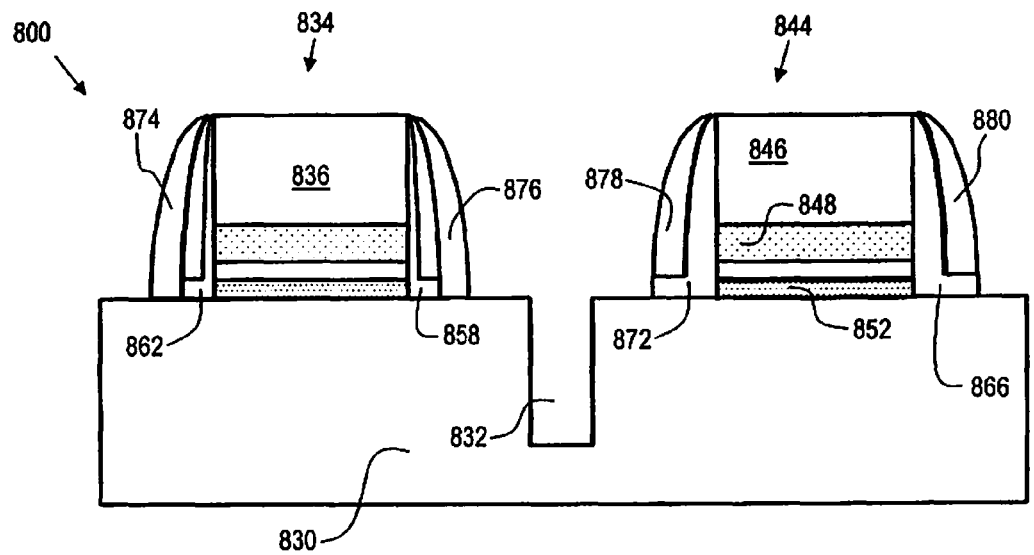

FIG. 8 shows a circuit 800 comprising two transistor gate stacks (834 and 844) after the annealing process. An activation anneal is performed in order to activate the dopants. In one embodiment, the activation anneal is a rapid thermal anneal (RTA) with a temperature ranging from about 950 degrees Centigrade (C) to about 1085 degrees C. for about 1 to about 10 seconds, depending on various process parameters, such as dopant diffusion rate. If the substrate is subject to the high temperatures of the RTA for too long, the integrated circuit may be damaged, and will not function properly. Optionally, Laser Spike Annealing (LSA) may be performed to provide additional dopant activation, if necessary. The activation anneal may not provide sufficient oxygen to achieve the desired increase in Vt of the low leakage NFETs. In that situation, a supplemental anneal with oxygen is performed. This anneal is preferably performed at a relatively low temperature, such as a temperature ranging from about 500C to about 650C. The low temperature anneal is desirable as to not further disperse the dopants by any significant measure. Because of the low temperatures, the duration of the anneal with oxygen can be longer (e.g. ranging from 1-30 minutes) than that of the activation anneal. Oxygen flow is performed during this anneal. The anneal with oxygen can be conducted utilizing a source comprising one or more of oxygen ($O_2$), plasma oxygen, ozone ($O_3$) and nitrous oxide ($N_2O$).

The anneal with oxygen has the effect of slightly (1-8 angstroms) increasing the effective oxide thickness (EOT) of interfacial layer 852 of low leakage NFETs, and causes the effective work function of the low leakage NFET metal gate 848 to shift towards the mid-gap region. This shift in work function is applied only to the low leakage NFET (gate stack 844) and is not applied to the logic transistor (gate stack 834) or any PFET. The shift in work function desirably increases the Vt of the low leakage transistor without adversely affecting the Vt of the logic transistor or PFETs. After the processing of the low leakage NFETs in accordance with embodiments of the present invention, the low leakage Vt delta, which is the Vt difference between logic NFETs and low leakage NFETs, ranges from about 100 mV up to about 400 mV. That is, the low leakage NFET has a Vt about 100 mV to about 400 mV higher than the Vt of logic NFETs on the same substrate. The low leakage Vt delta is accomplished without the need for undue process steps, thereby providing a method for fabricating SRAM modules of improved efficiency while not adding an excess of additional process steps.

Figure 9:
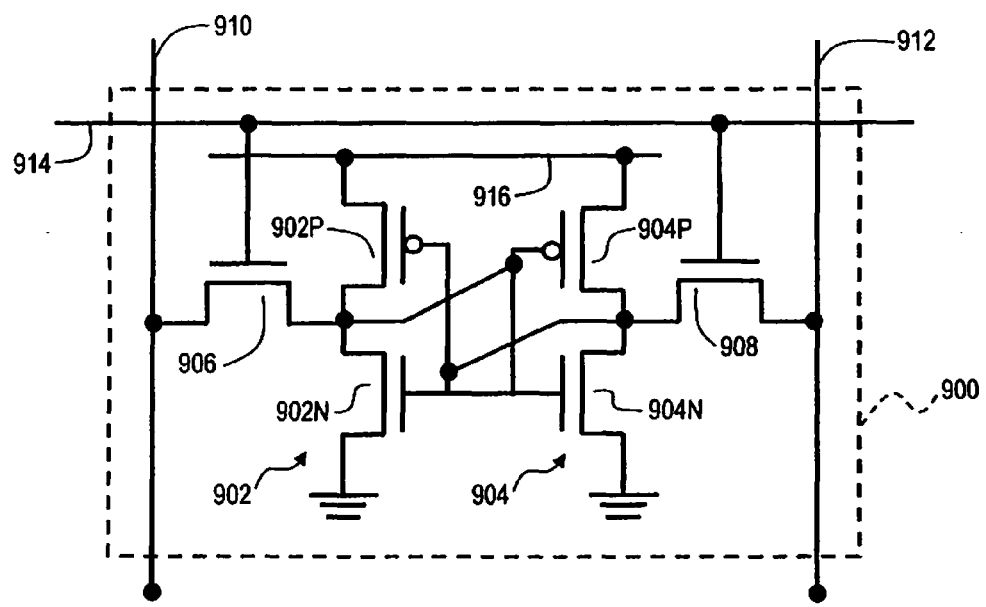

FIG. 9 shows an SRAM cell 900 in accordance with an embodiment of the present invention. Cell leakage is reduced by utilizing the aforementioned low leakage transistors for the NFET transistors within the SRAM cell. In FIG. 9, transistors 902N, 904N, 906, and 908 are comprised of low leakage transistors that are fabricated by the method described in this disclosure.

Figure 10:
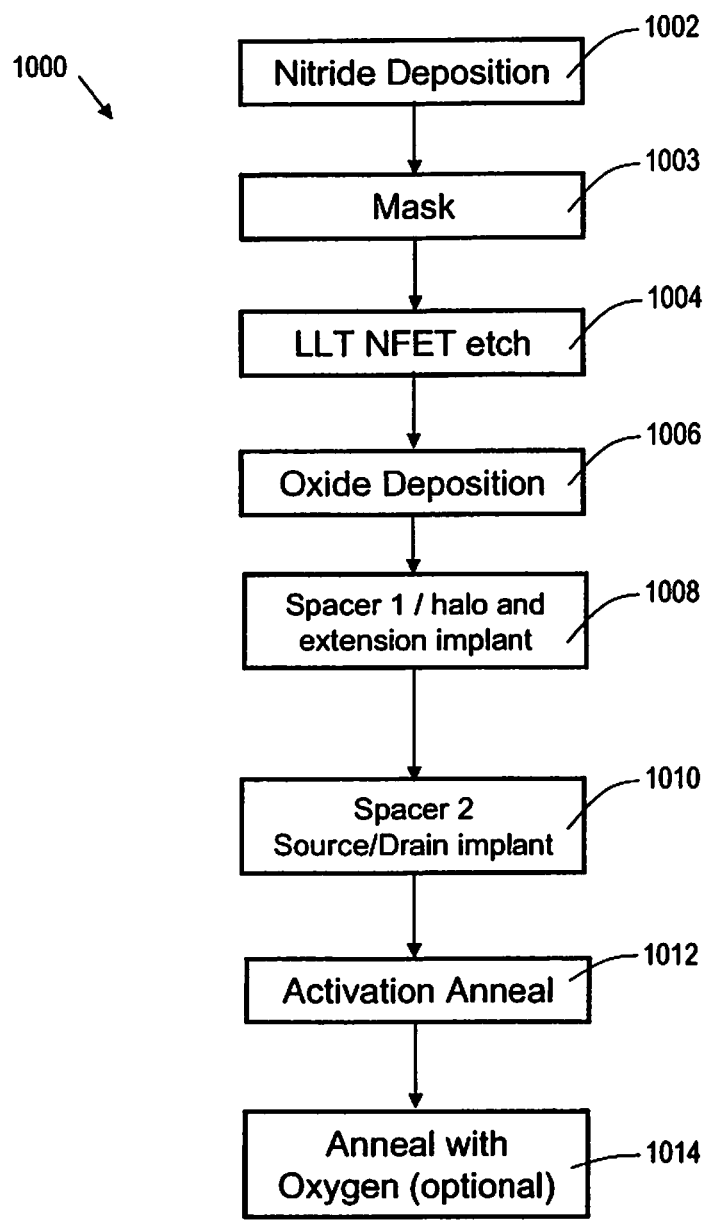

FIG. 10 is a flowchart indicating process steps to fabricate a low leakage transistor in accordance with embodiments of the present invention. In process step 1002, an MLD nitride deposition is performed to cover all gate stacks on an integrated circuit with a nitride layer. In process step 1003, a mask is applied to the substrate to protect PFETs and logic NFETs during the subsequent etch step. In process step 1004, the nitride layer is etched away from all low leakage NFETs on the integrated circuit. In process step 1006, an oxide is deposited on all gate stacks of the integrated circuit. In process step 1008, the first set of spacers is formed, and halo and extension implantation is performed, if necessary. In process step 1010, the second set of spacers is formed, and source/drain implantation is performed. In process step 1012, an activation anneal is performed. This anneal can be a rapid thermal anneal (RTA) with a temperature ranging from about 950 degrees Centigrade (C) to about 1085° C. Depending on the oxygen levels during the activation anneal (if the Oxygen level is too low), a supplemental anneal with oxygen flow is performed in step 1014. The anneal with oxygen serves to shift the effective workfunction of NEFT metal gate and increase the effective gate oxide thickness of the low leakage NFETs, thereby increasing the Vt and reduce gate leakage current of the low leakage NFETs, without adversely affecting PFETs within the SRAM cell, or any logic NFETs present on the integrated circuit. Furthermore, since the increase in Vt is achieved without an increase in dopant concentration in the channel, problems that often come with higher dopant concentrations, such as GIDL, junction leakage, and random dopant fluctuation which causes mismatch, are minimized with the inventive methods disclosed herein.

FIG. 11 shows a block diagram of an SRAM chip 1100. The SRAM chip 1100 comprises an SRAM array 1102 which is comprised of many individual SRAM cells 900. In addition to SRAM array, there is also logic circuitry 1104 which is comprised of multiple PFET and NFET transistors (not shown). The logic circuitry is not directly involved in memory storage, but may be used to provide an interface to external devices. The NFET transistors that are part of the logic circuitry 1104 are "logic NFETs" and are not subjected to the oxygen process that is applied to the low leakage NFETs. Therefore, the Vt of the logic NFETs is not affected, whereas the Vt of the low leakage NFETs is increased, thereby creating a Vt delta, wherein low leakage NFETs have a higher Vt value (in mV) than the logic NFETs.

As can now be appreciated, embodiments of the present invention provide an SRAM chip having improved performance characteristics, namely in terms of reduced current leakage while devices are in the standby state. Furthermore, the methods of fabricating the SRAM chip disclosed herein provide the benefits of not requiring many different process steps or masking levels, thereby reducing the cost of fabrication as compared with prior art methods attempting to address threshold voltage. Additionally, the dopant concentration is not increased as a result of performing the methods of embodiments of the present invention, hence problems that often come with higher dopant concentrations, such as GIDL and junction leakage, and mismatch due to random dopant fluctuation, are minimized.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of fabricating a semiconductor integrated circuit, comprising the steps of:
    depositing a nitride layer over a substrate comprising a plurality of field effect transistors, the plurality of field effect transistors comprised of low leakage NFETs, logic NFETs and PFETs, wherein each NFET and each PFET comprises a gate stack, and wherein the nitride layer is disposed on the gate stack of each NFET and the gate stack of each PFET;
    removing the nitride layer on the low leakage NFET gate stacks, thereby allowing the low leakage NFET gate stacks to be exposed to oxygen;
    depositing an oxide layer over the substrate;
    forming a first spacer set on each of the gate stacks;
    performing halo and extension implantation;
    forming a second spacer set on each of the gate stacks;
    adding dopants to the substrate; and
    performing an activation anneal on the substrate, thereby increasing the threshold voltage of each low leakage NFET within the semiconductor integrated circuit, without adversely affecting PFETs or logic NFETs within the semiconductor integrated circuit.

2. The method of claim 1, wherein the step of performing an activation anneal comprises performing a rapid thermal anneal with a temperature ranging from about 950° C. to about 1085° C.

3. The method of claim 1, wherein the step of adding dopants to the substrate comprises adding sufficient dopants to provide a dopant concentration ranging from about 1e18 $cm^{-3}$ to about 8e18 $cm^{-3}$.

4. The method of claim 1, further comprising the step of performing a supplemental anneal with oxygen after the activation anneal.

5. The method of claim 4, wherein the step of performing a supplemental anneal with oxygen comprises performing an anneal with a temperature ranging from about 500° C. to about 650° C.

6. The method of claim 4, wherein the step of performing a supplemental anneal with oxygen comprises performing an anneal for a duration of about 1 minute to about 30 minutes.

7. The method of claim 1, wherein the step of etching the nitride layer on the low leakage NFET gate stacks is performed via a hydrofluoric acid solution.

8. The method of claim 4, wherein the step of performing a supplemental anneal with oxygen comprises utilizing a source comprising one or more of oxygen ($O_2$), plasma oxygen, ozone ($O_3$) and nitrous oxide ($N_2O$).

9. The method of claim 1, wherein the step of depositing the nitride layer is performed via MLD.

10. The method of claim 1, wherein the step of depositing the oxide layer comprises depositing an oxide layer having a thickness ranging from about 30 to about 140 angstroms.

11. The method of claim 9, wherein the step of depositing the nitride layer comprises depositing a nitride layer having a thickness ranging from about 1 nanometer to about 7 nanometers.

* * * * *